United States Patent [19]

Cullen et al.

[11] Patent Number: 4,484,098

[45] Date of Patent: Nov. 20, 1984

[54] ENVIRONMENTALLY STABLE LITHIUM NIOBATE ACOUSTIC WAVE DEVICES

[75] Inventors: Donald E. Cullen, Manchester; Thomas W. Grudkowski, Glastonbury; Gerald Meltz, Avon, all of Conn.

[73] Assignee: United Technologies Corporation, Hartford, Conn.

[21] Appl. No.: 562,629

[22] Filed: Dec. 19, 1983

[51] Int. Cl.³ .............................................. H03H 9/25
[52] U.S. Cl. .................................. 310/313 A; 333/155
[58] Field of Search ...................... 310/313 A, 313 C; 333/151, 154, 155, 191, 193, 195, 196

[56] References Cited

U.S. PATENT DOCUMENTS 3,680,009  7/1972  Slobodnik, Jr. ................ 310/313 A
3,965,444  6/1976  Willingham et al. ............... 333/155
4,342,012  7/1982  Inaba et al. ......................... 333/155

OTHER PUBLICATIONS

Yamanouchi et al., "Piezoelectric Acoustic Boundary Waves Propagating Along the Interface of SiO$_2$ and LiTaO$_3$", IEEE T-SU, vol. SU-25, No. 6, Nov. 78, pp. 384-389.

Shibayama et al., "Saw and Boundary Wave Properties for SiO$_2$/LiTaO$_3$ Structure Fabricated by Plasma-CVD", Proc. 1980, IEEE Ultrasonics Symposium, pp. 455-459.

Primary Examiner—J. D. Miller
Assistant Examiner—D. L. Rebsch
Attorney, Agent, or Firm—M. P. Williams

[57] ABSTRACT

Acoustic Wave Devices comprise lithium niobate substrates 6, 22 having the principal plane cut at zero degrees and 128°, respectively, with respect to the Y crystallographic axis thereof, propagating in the X direction, with amorphous silicon dioxide surface layers of 0.42 and 1.24 wavelengths, respectively.

2 Claims, 4 Drawing Figures

ENVIRONMENTALLY STABLE LITHIUM NIOBATE ACOUSTIC WAVE DEVICES

The Government has rights in this invention, pursuant to Contract No. F49620-82-C-0074 awarded by the Department of the Air Force.

DESCRIPTION

1. Technical Field

This invention relates to acoustic wave devices, and more particularly to acoustic wave devices, employing lithium niobate substrates with amorphous silicon dioxide surface layers, which are relatively insensitive to variations in temperature, strain and environmental conditions at the ultimate surface.

2. Background Art

The most commonly utilized acoustic wave devices are composed of ST-cut quartz employing the Rayleigh type surface acoustic wave. The ST quartz substrate is found desirable since it has a first order temperature coefficient of phase velocity which is substantially zero at normal operating temperatures. However, the electromechanical coupling coefficient is extremely low (being a small fraction of a percent), and it is impossible to stabilize such devices against surface contamination: any significant moisture, oil or dust will totally damp out the surface wave.

A variety of attempts have been made to overcome the sensitivity of surface acoustic wave devices to surface contamination. One early attempt, employing a variety of different substrates, provides a semiconductor rigidly mounted above the surface of the substrate, separated by a discrete air gap. For instance, work reported by Yamanouchi et al, "Propagation and Amplification of Rayleigh Waves and Piezoelectric Leaky Surface Waves in LiNbO$_3$", J. App. Phys., Vol. 43, No. 3, March 1972, pp. 856–862, reported leaky waves achieved on 64° YZ-cut lithium niobate with a semiconductor layer spaced 0.5 micron above the surface thereof. Subsequently, temperature compensated YZ-cut lithium niobate and lithium tantalate substrates were provided with amoprhous silicon overcoats of varied thickness, as reported in Parker et al, "SiO$_2$ Film Overlays For Temperature-Stable Surface Acoustic Wave Devices", App. Phys. Let., Vol. 26, No. 3, Feb. 1975, pp. 75–77. Therein, it was reported that the thickness of the silicon dioxide overcoat required to achieve essentially zero first order temperature coefficient resulted in a leaky surface wave. The problem of a leaky wave was avoided by providing 54% of the surface with a silicon dioxide coating which is 0.7 of a wavelength (of the acoustic wave) thick, and the remainder of the coating which is 0.15 of a wavelength thick. However, the varied thickness results in losses due to reflections at the tapered edges of the thick film, and provides a device which is not uniform along all of the active region, therefore being useful only for gross delay lines, when the zero first order temperature compensation is important.

An interface wave (of the type referred to as a Stonley wave) in 126° Y-cut, X propagating lithium tantalate is reported in Yamanouchi et al, "Piezoelectric Acoustic Boundary Waves Propagating Along the Interface Between SiO$_2$ and LiTaO$_3$", IEEE Transactions on Sonics and Ultrasonics, Vol. SU-25, No. 6, Nov. 1978, pp. 384–389. This work verified the existence of essentially a boundary wave beneath silicon dioxide films ranging from 0.5 to 2.4 wavelengths in thickness by damping the Rayleigh wave by the application of viscoelastic tapes (absorbing material) on the surface of the silicon dioxide. Another study, in which 126° YX lithium tantalate with silicon dioxide overcoats up to 0.5 wavelength in thickness, is reported in Shibayma et al, "SAW and Boundary Wave Properties For SiO$_2$/LiTaO$_3$ Structure Fabricated By Plasma-CVD", Proceedings 1980 IEEE Ultrasonics Symposium, pp. 455–459.

Little attention has apparently been given in the literature to the design of acoustic devices for minimizing the sensitivity of acoustic wave phase velocity to substrate strain. Perhaps this is because the strain coefficient is relatively low in ST quartz; or, perhaps this is because most of the effort relative to strain has been concentrated on the packaging associated with the device (the substrate carrier).

DISCLOSURE OF INVENTION

Objects of the invention include provision of acoustic wave devices which have adequate electroacoustic coupling coefficient and which are relatively insensitive to temperature, strain and surface contamination.

According to the invention, a lithium niobate structure, cut at one of a predetermined, limited number of angles with respect to its crystallographic Y axis, with an amorphous silicon dioxide surface layer which has a selected one of a predetermined limited number of thicknesses, corresponding to the angle of the substrate cut, which is between substantially 0.4 and substantially 1.25 wavelengths, provide acoustic wave devices having a zero first order temperature coefficient of wave velocity and a low second order temperature coefficient of wave velocity, parallel and perpendicular strain sensitivities of less than 0.3 parts per million per microstrain, substantial insensivity to surface contamination, and coupling coefficients of at least several percent.

According to one embodiment of the invention, a lithium niobate substrate Y-cut (zero degrees with respect to the Y crystallographic axis) employs an amorphous silicon dioxide surface layer which is substantially 0.42 wavelengths thick. In accordance with another embodiment of the invention, a lithium niobate substrate which is cut 128° with respect to the crystallographic Y axis employs an amorphous silicon surface layer which is substantially 1.24 wavelengths thick.

The foregoing and other objects, features and advantages of the present invention will become more apparent in light of the following detailed description of exemplary embodiments as illustrated in the accompanying drawings.

BEST MODE FOR CARRYING OUT THE INVENTION

Figure 1:
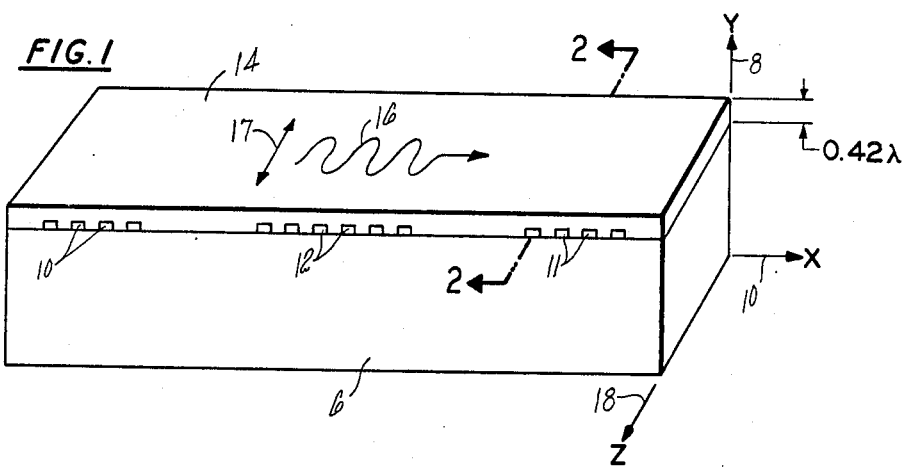
FIG. 1 is a simplified, side elevation pictorial view of a zero Y-cut, X propagating, lithium niobate acoustic wave device in accordance with one embodiment of the invention.
Figure 2:
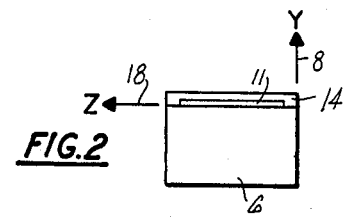
FIG. 2 is a simplified, sectioned, end elevation pictorial view taken on the line 2—2 in FIG. 1.

Referring to FIGS. 1 and 2, a first embodiment of the invention employs a lithium niobate substrate 6 which is Y-cut (zero degrees to the Y axis) as indicated by the arrow 8 with propagation along the X axis as indicated by the arrow 10. The substrate has metallization disposed thereon to provide interdigital acoustoelectric transducers 10, 11 in the usual fashion, along with whatever suitable tap devices 12 may be desired (if any). Then the substrate and metallization forming the taps and transducers is overcoated with a surface layer 14 of amorphous silicon, such as by any well known RF sputtering or plasma chemical vapor deposition process. In this case, the thickness of the silicon dioxide is 0.42 wavelengths.

What results is a device in which the acoustic wave is principally a shear-horizontal surface acoustic wave propagating in the X direction as indicated by the arrow 16. The principal particle motion of the wave is in the Z direction as indicated by the arrows 17 and 18. The horizontal shear wave will not couple into low viscosity fluid; and therefore surface contamination does not affect it much. This is in contrast with a Rayleigh wave which has substantial shear vertical components (into and out of the surface), whereby surface contamination (oil, moisture, dust) will tend to damp out the Rayleigh wave. A way to compare the two waves is to consider that the Rayleigh wave is similar to an ocean wave in having vertical displacement, whereas the shear horizontal wave is mostly horizontal. Various samples of the embodiment of FIGS. 1 and 2 were tested and found to have parallel strain sensitivity of no more than −0.2 parts per million change per microstrain and perpendicular strain sensitivity of no more than −0.3 parts per million change per microstrain, thereby indicating extremely low sensitivy to strain. With the silicon dioxide layer having a thickness of substantially 0.42 wavelengths, a zero first order temperature coefficient of phase velocity is exhibited at about 50° C. Varying the thickness alters the temperature at which zero first order temperature coefficient is achieved. This is accompanied by a low second order phase velocity temperature coefficient, being on the order of 0.2 parts per million per degree C, per degree C. The device exhibited a very high acoustoelectric coupling constant of about 7%. Other characteristics of the device, including insertion loss, propagation loss, reflectivity, amplification constant and the like have been found to be suitable for utilization in a wide variety of acoustic wave applications of the type known to the prior art.

Figure 3:
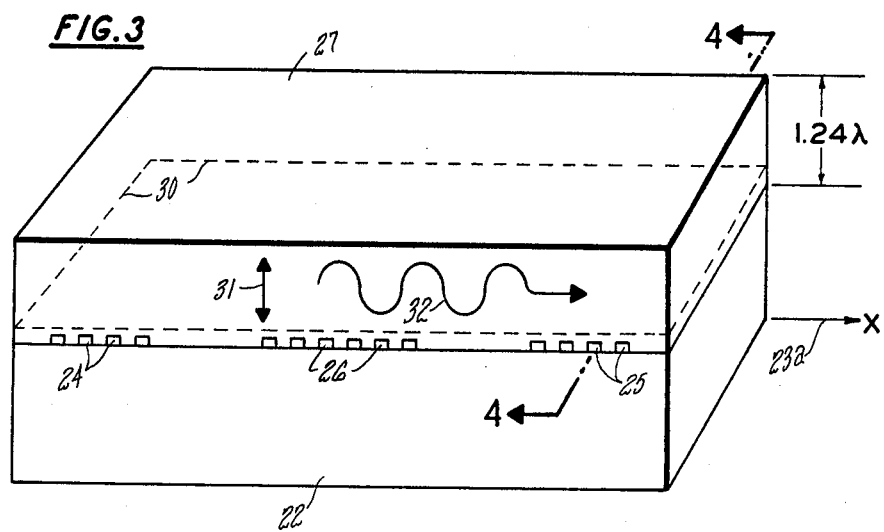
FIG. 3 is a simplified, side elevation pictorial view of a 128° Y-cut, X propagating, lithium niobate acoustic wave device in accordance with another embodiment of the invention.
Figure 4:
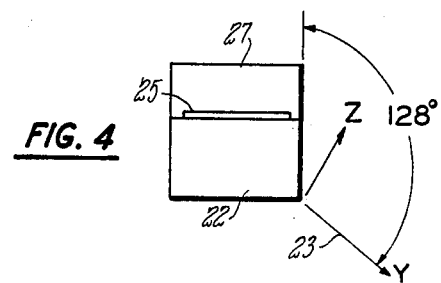
FIG. 4 is a simplified, sectioned, end elevation pictorial view taken on the line 4—4 in FIG. 3.

The second embodiment of the invention, illustrated in FIGS. 3 and 4, employs a lithium niobate substrate 22 which is 128° Y-cut (128° with respect to the crystallographic Y axis) as indicated by the arrow 23 in FIG. 4, with propagation in the X direction as indicted by the arrow 23a. on the upper surface of the substrate 22, metallization provides transducers 24, 25 and taps, 26, as desired, in any well-known usual way. Above the upper surface of the substrate 22 and metallization 24–26, an amorphous silicon dioxide surface layer 27 is provided with a thickness of 1.24 wavelengths. This results in a semi-boundary wave, which may be referred to as a generalized Stonley wave, centered in a plane indicated by the dotted line 30 which is separated a small distance from the interface or boundary between the lithium niobate and the silicon dioxide (such as on the order of 0.3 wavelengths). This wave is essentially a Stonley wave, having a substantial shear vertical component as indicated by the arrow 31, propagating in the X direction as indicated by the arrow 32. Examples of this device were tested and found to have both parallel and perpendicular strain coefficient of shear velocity of less than 0.2 parts per million per microstrain. A zero first order temperature coefficient of phase velocity exists at around 50° C., and a second order temperature coefficient of phase velocity was found to be approximately 0.04 parts per million per degree C, per degree C. Because the wave exists wholly within the material (substantially within the silicon dioxide and somewhat in the lithium niobate), the wave is obviously insensitive to any ordinary surface contamination. Further, the device was found to have a piezoelectric coupling coefficient of about 7½%. Variation in the thickness of the silicon dioxide surface layer by a tenth of a wavelength or so will not unduly affect the wave, but will have significant effect on the temperature at which a zero first order temperature stability is achieved, and may affect the second order temperature coefficient. Thus, it is believed preferred to have the thickness of the silicon dioxide surface layer within a few hundredths of 1.24 wavelengths.

Although the invention has been shown and described with respect to exemplary embodiments thereof, it should be understood by those skilled in the art that various changes, omissions and additions may be made therein and thereto without departing from the spirit and the scope of the invention.

We claim:

1. An acoustic wave device, comprising:
    a lithium niobate substrate having a principal plane cut at an angle of zero degrees with respect to its Y crystallographic axis with propagation in the X direction;
    electroacoustic transducer metallization disposed on said surface; and
    a surface layer of amorphous silicon dioxide disposed on said surface and over said metallization, said layer having a thickness of substantially 0.42 wavelengths of the acoustic wave in said device.

2. An acoustic wave device, comprising:
    a lithium niobate substrate having a principal plane cut at at an angle of 128 degrees with respect to its Y crystallographic axis with propagation in the X direction;
    electroacoustic transducer metallization disposed on said surface; and
    a surface layer of amorphous silicon dioxide disposed on said surface and over said metallization, said layer having a thickness of substantially 1.24 wavelengths of the acoustic wave in said device.

* * * * *